United States Patent [19]

Ellis, Jr.

[11] 4,294,007

[45] Oct. 13, 1981

[54] METHOD OF MOUNTING THICK FILM HYBRID CIRCUITS IN PRINTED CIRCUIT BOARDS

[75] Inventor: Paul R. Ellis, Jr., Alburquerque, N. Mex.

[73] Assignee: GTE Automatic Electric Laboratories, Inc., Northlake, Ill.

[21] Appl. No.: 108,624

[22] Filed: Dec. 31, 1979

Related U.S. Application Data

[62] Division of Ser. No. 417, Jan. 2, 1979, Pat. No. 4,257,668.

[51] Int. Cl.³ ............................................. H05K 3/36
[52] U.S. Cl. ..................................... 29/830; 29/418; 29/423; 228/180 R; 228/212
[58] Field of Search ............... 29/830, 837, 838, 839, 29/840, 843, 426.1, 426.4, 426.5, 423, 418; 361/413, 412, 399; 174/68.5, 52 PE; 228/180 R, 212; 339/17 C

[56] References Cited

U.S. PATENT DOCUMENTS

| | | | |
|---|---|---|---|
| 3,012,315 | 12/1961 | Stillwagon, Jr. | 29/423 |
| 3,604,836 | 9/1971 | Pierpont | 174/52 PE |
| 3,766,631 | 10/1973 | Scheitlin et al. | 29/423 X |
| 3,790,916 | 2/1974 | Keitel | 339/176 MP X |
| 3,842,479 | 10/1974 | Willey | 29/423 |
| 4,089,042 | 5/1978 | Torburn | 361/399 X |
| 4,127,692 | 11/1978 | Boynton | 228/170 X |

Primary Examiner—Nicholas P. Godici
Assistant Examiner—C. J. Arbes
Attorney, Agent, or Firm—Russell A. Cannon

[57] ABSTRACT

In this method of fabricating an electrical circuit assembly, a thick film hybrid substrate is held in an inverted position as apertured glass-ceramic beads are placed over the end leads on the substrate. A drop of liquid flux is then applied to the apertures to hold the beads in place. After the flux dries, the leads are inserted into plated-through holes in a circuit board, with the beads locating portions of the leads above the board. Following wave soldering of the board, the beads are fractured with a sharp instrument prior to a cleaning operation which removes bead parts from the soldered assembly. In this manner, the substrate is flexibly mounted in the board so that the substrate can be tilted without damaging it.

7 Claims, 5 Drawing Figures

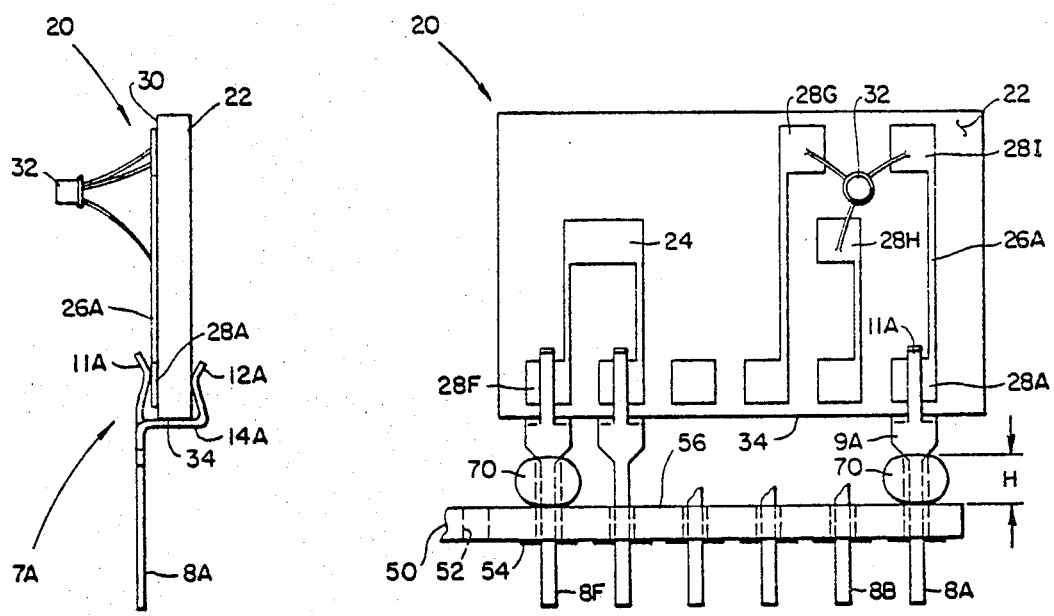
Fig. 2
Fig. 3
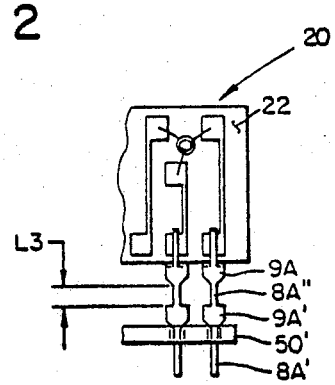
Fig. 5
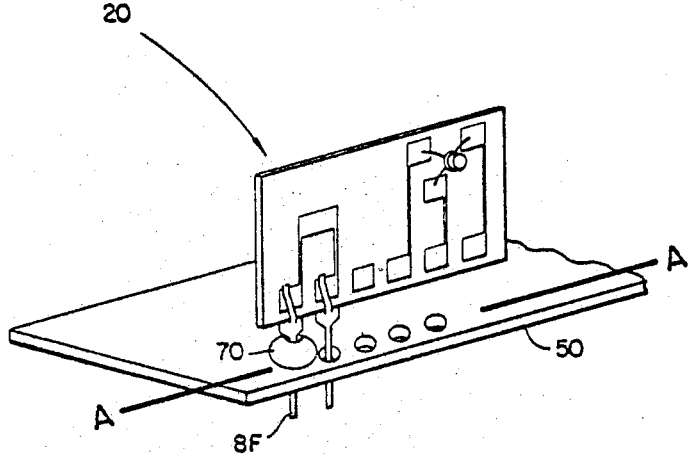
Fig. 4
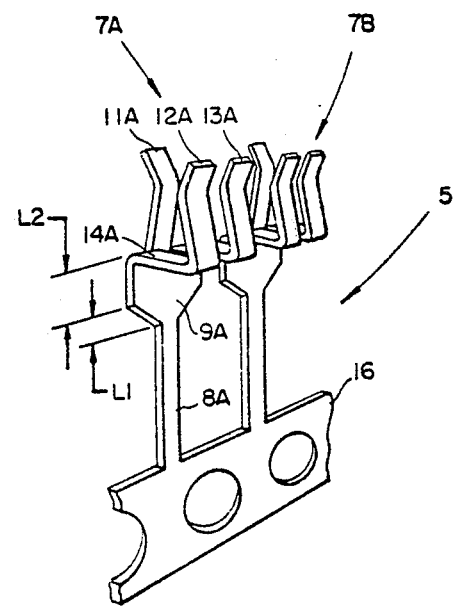
Fig. 1

METHOD OF MOUNTING THICK FILM HYBRID CIRCUITS IN PRINTED CIRCUIT BOARDS

This is a division of application Ser. No. 000,417, filed Jan. 2, 1979, now U.S. Pat. No. 4,257,668, issued Mar. 24, 1981.

FIELD OF INVENTION

This invention relates to the manufacture of electrical circuit assemblies and more particularly to an improved method of flexibly mounting a thick film hybrid substrate with leads thereon soldered in plated-through holes of a printed circuit board so that the substrate can be tilted in a plane orthoginal thereto without damaging it.

DESCRIPTION OF DRAWING

This invention and prior art structures will be more fully understood from the following detailed descriptions that make reference to illustrations in the drawing where:

FIG. 1 is a perspective view of a conventional terminal strip 5 carrying a plurality of edge clip terminals 7;

FIG. 2 is a right side elevation view of a hybrid circuit assembly 20 having a strip 5 clipped over the bottom edge 34 of a substrate 22, with the carrier bar 16 removed from the terminal strip;

FIG. 3 is a front elevation view of a hybrid circuit 20 supported in a printed circuit board 50 in accordance with this invention;

FIG. 4 is a perspective view of the structure in FIG. 3; and

FIG. 5 is a front elevation view of a portion of a hybrid circuit 20' supported in a circuit board 50' in accordance with a modified form of this invention. In order to more clearly illustrate structural detail here, the figures are not drawn to scale.

DESCRIPTION OF PRIOR ART

The thick film hybrid circuit 20 in FIGS. 2 and 3 is conventional (except for the beads 70 in FIG. 3) and comprises a rectangularly shaped glass-ceramic substrate 22 having a resistor 24 and conductive patterns of lines 26 and lands 28 formed on one side 30 thereof; a transistor 32; and edge clip terminals 7. In one method of manufacturing such hybrid circuits, tines 11–13 of terminals 7 in an edge mounting terminal strip 5 in FIG. 1 are snapped over the bottom edge 34 of the substrate 22 as is shown in FIG. 2. The terminal strip is stamped out of a sheet of 0.010 inch thick brass, for example, and tin plated, the leads 8 being typically 0.020 inch wide and terminating on a diamond shaped transition region 9 having a width of 0.060 inch, a tapered section of length L1=0.030 inch, and body of length L2=0.050 inch. The terminal strip 5 and substrate (not including the transistor 32) are then dipped in molten solder to electrically connect front tines 11 to associated lands 28A–28F. This also tins the terminal leads 8 and conductive patterns on the substrate. After connecting transistor 32 in the circuit 20 by reflow soldering, the carrier strip 16 is removed and the free ends of leads 8 are inserted into associated ones of the plated-through holes 52 in a printed circuit mother board 50, as is generaly illustrated in FIG. 3 except for the beads 70. The terminal strips 5 were designed to locate leads 8 in circuit board holes having a diameter that is only slightly greater than the width of the leads. In such an application, the transition regions 9 of clip terminals 7 provide a stand off between a substrate and a circuit board that is approximately equal to the sum of the lengths L1 and L2 in FIG. 1. In order to facilitate insertion of leads 8 into holes 52 of circuit boards 50 in a manufacturing operation, however, the holes 52 are made about 0.042 inch in diameter which is typically greater than twice the broadest dimension of the leads. This causes the major portion of the length L1 of tapered sections of transition regions 9 to be located in circuit board holes 52 and allows the substrate to tilt as much as 45°. Since leads 8 and transition regions 9 of terminals 7 are now tinned, solder wicks up leads 8 and around tines 11–13 and transition regions 9 in FIG. 2 during wave soldering to rigidly fix the position of the substrate in the circuit board. It has been discovered that this inflexible mounting of a substrate is a principal reason for hybrid damage such as fracturing of a substrate by an operator bending it out of the way of other parts and during flexure of the circuit board.

Although the support in U.S. Pat. No. 4,089,042, issued May 9, 1978, of Roy B. Torburn, provides a standoff between a hybrid substrate and a circuit board, modification of a circuit board is required to use it. Also, considerable surface area of a board must be free of other components in order to use that support which rigidly fixes the position of a substrate. Specially molded sugar cubes have previously been located on leads of relatively light elements such as transistors to provide standoff during soldering of transistor leads to traces on a circuit board. They are unsatisfactory for providing standoff for substrates, however, since the porous sugar cube absorbs liquid flux which is applied to terminal leads to fix their position as the leads are inserted into holes on a circuit board. Also, this requires the additional step of washing the assembled substrate and circuit board in water to dissolve and remove the sugar cubes, and then drying the assembly. Wax beads impregnated with a glass powder have also been used for holding relatively light components such as a transistor offset from a circuit board during a solder operation. They are also unsatisfactory for providing standoff of substrates since the wax members sublime at room temperature and are softened by liquid flux which is absorbed into the structure. This makes it difficult to use them in a production operation where a hybrid substrate may sit for a period of time prior to its assembly into a circuit board and wave soldering. The flux in the wax also makes it difficult to clean the latter off of an assembly with Freon after a soldering operation. Further, since the hybrid substrate is relatively heavy and has its weight concentrated across a narrow edge of a substrate, it tends to collapse the wax member which softens considerably during a wave solder operation.

An object of this invention is the provision of an improved method of mounting a hybrid substrate in a circuit board with a prescribed standoff. Another object is the provision of an improved method of flexibly mounting a hybrid substrate in a circuit board so that the substrate may be tilted without damaging it.

SUMMARY OF INVENTION

A method embodying this invention for flexibly mounting a hybrid circuit assembly having terminal leads depending from an edge of a substrate and soldered in associated holes of a mother board comprises the step of locating fracturable apertured beads over a plurality of leads prior to soldering for spacing portions of the leads and the edge of the substrate above the adjacent surface of the board. Following a soldering operation, the beads are fractured and removed from the leads so that the substrate can be tilted without damaging it.

DESCRIPTION OF PREFERRED EMBODIMENTS

Hybrid circuit assemblies 20 having clip terminals 7 soldered thereto are normally stored in trays (not shown) in their inverted position (which is opposite to that in FIG. 2) prior to assembly in circuit boards 50 having plated-through holes 52 associated with conductive traces 54 on the underside thereof. While a hybrid circuit 20 is in its inverted position, apertured beads 70 are located over the end or outermost leads 8A and 8F thereof. A drop of liquid rosin flux is then placed on each of the end leads at a point adjacent the aperture in the bead so that this flux runs along the leads and into the bead apertures. The flux is allowed to dry in the apertures of beads 70 so that they will not fall off of leads when a beaded hybrid circuit is held in an upright position.

The apertures through the beads 70 are preferrably only slightly larger than the largest cross-sectional dimension of leads 8 so that the beads slide smoothly onto leads and a small amount of flux flows into the apertures. By way of example, the diameter of apertures is approximately 0.023 inch for beads used on 0.010 inch thick leads that are 0.020 inch wide. This allows the tapered section of a transition region to drop only a few thousandths of an inch into the aperture of a bead. The beads 70 are heat resistant and hard enough to support a substrate 22 in a wave solder operation. They are also relatively non-porous so that the liquid flux is not absorbed into them. Further, the beads are brittle so that they are readily fractured, as is described more fully hereinafter, when it is desirable to remove them from a circuit assembly. Beads meeting these criteria may be cylindrically or spherically shaped and made of glass or ceramic material.

Beaded hybrid circuits are individually removed from a storage tray and held in their upright position as the free ends of leads 8 are inserted into holes 52 of a circuit board 50 (see FIG. 3). Each stuffed circuit board 50 is then loaded in a carrier (not shown) and passed through a wave solder operation in the conventional manner to solder leads 8 into associated ones of the plated-through holes 52 and to traces 54 on the board. The height H of beads 70 is selected to hold a substrate spaced above the top surface 56 of a circuit board so that a portion of the narrow leads 8 is located above the board. More specifically, the thickness of beads is selected to hold the tapered sections on transition regions 9 at least 0.050 inch above the circuit board so that solder will not wick up leads and into the area of the tines and transition region of a terminal when the aperture in a bead is much larger than the thickness or width of a lead.

The soldered circuit board may be cleaned in an agitation type Freon bath to remove flux therefrom. During an inspection and touch-up operation of a soldered circuit board 20, the point of a thin-sharp instrument such as an Xacto knife is located in the top of the aperture in a bead 70. Pressure is then exerted by the sharp knife edge of the blade onto the top edge of the bead in order to fracture it. This operation is repeated for all beads on the hybrid circuit 20. After the bead parts are pushed away from leads, the soldered circuit board is passed through a second cleaning operation which removes the bead parts and any flux left on the beaded leads. In this manner, a hybrid circuit 20 is flexibly mounted on a circuit board 50 so that it can be tilted about the line A—A in FIG. 4 without damaging it.

Although this invention is described in relation to preferred embodiments thereof, variations and modifications will occur to those skilled in the art. By way of example, the beads may be cylindrically shaped ferrite cores or slugs, truncated spherically shaped members, or non-symmetrically shaped members. Also, the cross-sections of apertures may be other than circular and apertures may be spaced from the center of beads, although it is necessary that apertures extend substantially straight through them. Additionally, the circuit 20 may be other than a thick film circuit and be mounted in a structure other than a printed circuit board. Also, the beads may be prevented from falling off of the leads 8 by paste flux or white glue. Further, the beads may be left on the leads and located on other than the end leads. The scope of this invention is therefore determined by the attached claims rather than from the aforementioned detailed description.

What is claimed is:

1. In a method of fabricating an electrical circuit assembly including a hybrid circuit having flexible terminal leads that depend from a substrate and extend through holes in a mother board and are soldered to conductive traces on the board, the improvement comprising the steps of:
   inserting at least a pair of leads into apertures extending through associated fracturable beads that are relatively non-porous for spacing the substrate and portions of the leads above the board during soldering of leads to traces,
   fracturing the beads following soldering of the board, and
   removing bead parts from leads so that the leaded substrate may be tilted generally about the line intersection of planes containing surfaces of the substrate and the board.

2. The method according to claim 1 including the additional step of adding a dab of holding material to each bead aperture and/or associated lead for keeping beads from falling off of leads when a substrate is held upright for insertion of leads into holes of the board.

3. The method according to claim 2 wherein the holding material is liquid flux that has a holding property which increases as it dries and where said first named step comprises inserting the end leads on a substrate in apertures of associated beads.

4. In an electrical circuit assembly including a mother board having holes therethrough that are associated with conductive traces and a hybrid substrate having flexible terminals with a transition region between tines which snap over the edge of the substrate and leads that are more narrow than the transition region, the method of flexibly mounting substrate leads in holes of the board comprising the steps of:
   locating apertured beads, which are relatively non-porous and fracturable, over associated leads;
   locating the free ends of leads in associated holes in a board with the beads contacting a surface of the board for spacing the edge of the substrate and portions of leads above this surface of the board;
   soldering the free ends of leads to conductive traces on the board;

fracturing the beads; and separating bead parts from leads so that the leaded substrate may be tilted generally about the line of intersection of planes containing broad surfaces of the substrate and the board without damaging the substrate.

5. The method according to claim 4 including the additional step of holding a substrate in a generally inverted position with beads on the leads and applying flux to each bead aperture and/or associated lead to prevent beads falling off of leads when the substrate is held generally upright for insertion of leads into associated holes of the board.

6. The method according to claim 5 wherein said first named locating step comprises locating beads on the two outermost leads on a substrate.

7. The method according to claim 4 wherein the apertures in beads are dimensioned for sliding over leads and contacting associated transition regions for spacing a substrate from the board and portions of leads above the board.

* * * * *